United States Patent
Youn

(12) 
(10) Patent No.: US 7,310,267 B2
(45) Date of Patent: Dec. 18, 2007

(54) NAND FLASH MEMORY DEVICE AND METHOD OF MANUFACTURING AND OPERATING THE SAME

(75) Inventor: Tae Un Youn, Daejeon-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/275,282

(22) Filed: Dec. 21, 2005

(65) Prior Publication Data

US 2007/0002627 A1 Jan. 4, 2007

(30) Foreign Application Priority Data

Jun. 30, 2005 (KR) .................. 10-2005-0057917

(51) Int. Cl.
*G11C 11/34* (2006.01)
(52) U.S. Cl. ................. 365/185.05; 365/185.17; 365/185.11
(58) Field of Classification Search .......... 365/185.05, 365/185.17, 185.11
See application file for complete search history.

(56) References Cited

U.S. PATENT DOCUMENTS

| | | | |
|---|---|---|---|
| 5,473,563 A * | 12/1995 | Suh et al. ............... | 365/185.13 |
| 5,953,254 A * | 9/1999 | Pourkeramati ......... | 365/185.26 |
| 6,034,894 A * | 3/2000 | Maruyama et al. .... | 365/185.17 |
| 6,121,670 A * | 9/2000 | Hisamune ............... | 257/623 |
| 6,218,689 B1 * | 4/2001 | Chang et al. ........... | 257/288 |
| 6,243,295 B1 * | 6/2001 | Satoh ..................... | 365/185.17 |
| 6,512,253 B2 * | 1/2003 | Watanabe et al. ....... | 257/208 |
| 6,512,262 B2 * | 1/2003 | Watanabe ................ | 257/316 |
| 6,756,631 B2 * | 6/2004 | Wu .......................... | 257/316 |
| 6,819,592 B2 * | 11/2004 | Noguchi et al. ........ | 365/185.17 |
| 6,910,013 B2 * | 6/2005 | Allegro et al. .......... | 704/256 |
| 6,925,008 B2 * | 8/2005 | Ichige et al. ............ | 365/185.17 |
| 7,082,055 B2 * | 7/2006 | Ichige et al. ............ | 365/185.17 |

FOREIGN PATENT DOCUMENTS

| | | |
|---|---|---|
| KR | 1996-0036047 | 12/1998 |
| KR | 1997-0072400 | 2/1999 |
| KR | 2004-0035569 A | 4/2004 |

\* cited by examiner

*Primary Examiner*—Viet Q. Nguyen
(74) *Attorney, Agent, or Firm*—Marshall, Gerstein & Borun LLP

(57) ABSTRACT

A NAND flash memory device, and more particularly, to NAND flash memory device and method of manufacturing operating the same as described. A dielectric film and a conduction layer are formed between cell gates so that between-cell gates are buried. Therefore, an interference effect between floating gates, which becomes profound with the level of integration increasing, and program threshold voltage distributions between cells can be improved.

7 Claims, 1 Drawing Sheet

NAND FLASH MEMORY DEVICE AND METHOD OF MANUFACTURING AND OPERATING THE SAME

TECHNICAL FIELD

This patent relates to NAND flash memory devices, and more particularly, to NAND flash memory device, and method of manufacturing operating the same, in which an interference effect can be reduced through reduction of coupling capacitance between floating gates.

DISCUSSION OF RELATED ART

A NAND flash memory device includes a number of cell blocks. One cell block includes a number of cell strings in which a number of cells for storing data are connected in series to form one string, and a drain select transistor and a source select transistor formed between a cell string and the drain and a cell string and the source, respectively. A cell of the NAND flash memory device is formed by forming an isolation film in a predetermined region on a semiconductor substrate through a Shallow Trench Isolation (STI) process, forming a gate in which a tunnel oxide film, a floating gate, a dielectric film and a control gate are stacked in a predetermined region on the semiconductor substrate, and then forming junctions at both sides of the gate.

In the NAND flash memory device constructed above, as the design rule reduces, a distance between cells is reduced. Therefore, an interference effect in which the state of the cells is changed under the influence of the operation of neighboring cells is generated. For example, during the program operation, a threshold voltage of a program cell rises under the influence of threshold voltages of peripheral cells due to the floating gate interference effect. Since threshold voltage distribution of the program cell is widely changed, a phenomenon in which a chip is failed is generated. The floating gate interference effect is proportional to coupling capacitance between the floating gates. As the design rule reduces, the floating gate interference effect becomes more profound.

SUMMARY OF THE INVENTION

A NAND flash memory device, and method of manufacturing operating the same, may include a dielectric film and a conduction layer formed to bury between-cell gates, thus reducing capacitance between floating gates and reducing an inter-cell interference effect.

A NAND flash memory device may include a semiconductor substrate in which a cell region, a source select transistor region and a drain select transistor region are defined, a number of cell gates in which a tunnel oxide film, a floating gate, a first dielectric film and a control gate are stacked in a predetermined region on the semiconductor substrate of the cell region, a junction formed on the semiconductor substrate between the cell gates, a select transistor gate formed in a predetermined region on the semiconductor substrate of the source select transistor region and the drain select transistor region, a source formed on the semiconductor substrate between the source select transistor gates and a drain formed on the semiconductor substrate between the source and drain select transistor gates, and a second dielectric film and a conduction layer formed in the cell region so that between-the cell gates are buried.

A method of manufacturing a NAND flash memory may include defining a cell region, a source select transistor region and a drain select transistor region on a semiconductor substrate, forming a number of stack gates in which a tunnel oxide film, a floating gate, a first dielectric film and a control gate are stacked in a predetermined region on the semiconductor substrate of the cell region, and simultaneously forming a gate oxide film and a gate in the semiconductor substrate of the source and drain select transistor regions, performing an ion implant process to form a junction, a source and a drain in the semiconductor substrate of the cell region, and the source and drain select transistor regions, forming a second dielectric film and a conduction layer on the entire structure, and then blanket-etching the conduction layer and the second dielectric film so that the semiconductor substrate of the source and drain select transistors is exposed, removing the conduction layer remaining on the source and drain select transistor regions, forming a first insulation film on the entire structure, and then etching the first insulation film so that the source is exposed, thus forming a source plug, forming a second insulation film on the entire structure, etching the first and second insulation films so that the drain is exposed, and forming a drain plug, and etching a predetermined region of the first and second insulation films so that the conduction layer is exposed, thus forming a plug.

A distance between the gates of the cell region may be narrower than a distance between the gates of the source and the drain select transistor regions.

Between-the gates of the cell region may be buried with the second dielectric film and the conduction layer by means of a blanket etch process.

In a method of driving a NAND flash memory device, a read operation of a selected block may be performed by applying 0V to a selected word line, 4.5V to a non-selected word line, 4.5V to a drain select transistor and a source select transistor, respectively, 1V to a selected bit line, 0V to a non-selected bit line, 0V to a source line, 0V to a bulk and 0V to a conduction layer formed between cell gates, a program operation of a selected block is performed by applying a program voltage of Incremental Step Pulse Programming (ISSP) method to a selected word line, 9.5V to a non-selected word line, Vcc and 0V to a drain select transistor and a source select transistor, respectively, 0V to a selected bit line, Vcc to a non-selected bit line, Vcc to a source line, 0V to a bulk and 0V to a conduction layer formed between the cell gates, and an erase operation of a selected block is performed by applying 0V to a selected word line and a non-selected word line, respectively, making floated a drain select transistor, a source select transistor, a selected bit line, a non-selected bit line and a source line, applying 19V to a bulk and applying 0V to a conduction layer formed between the cell gates.

DETAILED DESCRIPTION OF PREFERRED EMBODIMENTS

Figure 1A:
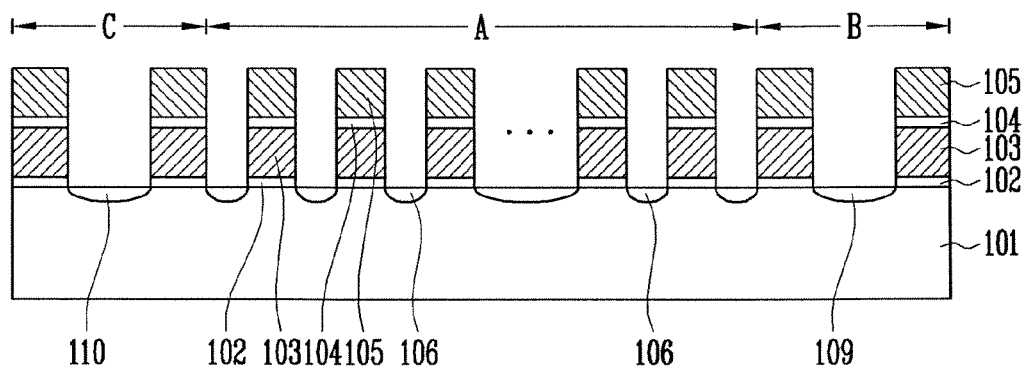
FIGS. 1a to 1c are sectional views for illustrating a method of manufacturing a NAND flash memory device.
Figure 1B:
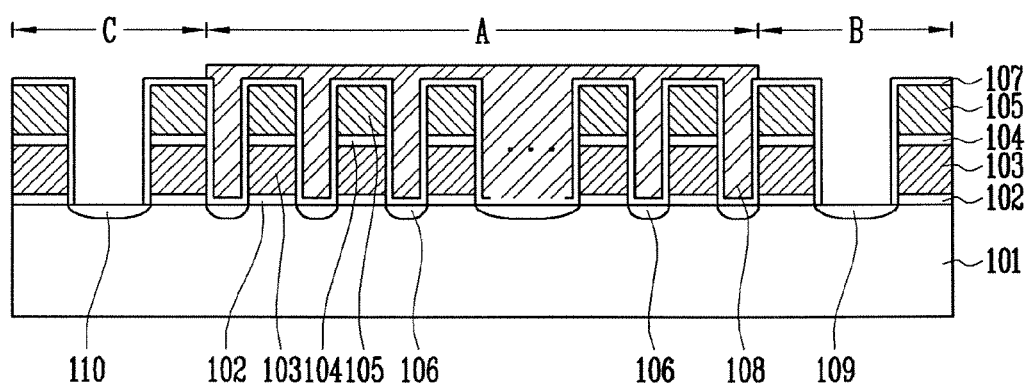
Figure 1C:
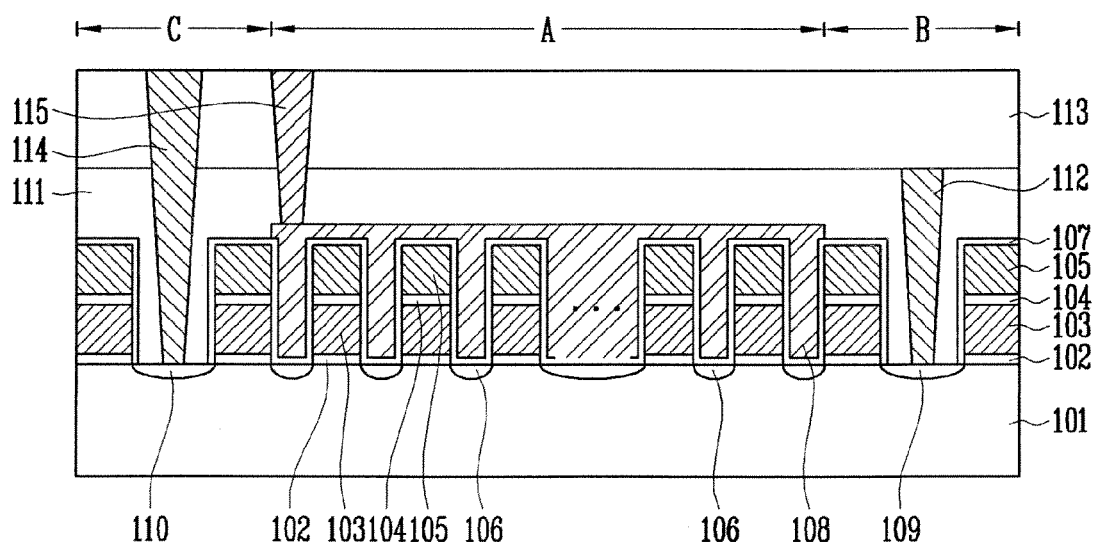

FIGS. 1a to 1c are sectional views for illustrating a method of manufacturing a NAND flash memory device.

Referring to FIG. 1a, a cell region A, a source select transistor region B, a drain select transistor region C, and a number of high voltage and low voltage transistor regions are defined in a semiconductor substrate 101 by a well ion implant process and an isolation film formation process.

A stack gate in which a tunnel oxide film 102, a first conduction layer 103, a first dielectric film 104 and a second conduction layer 105 are stacked is formed on the semiconductor substrate 101 of the cell region A. At this time, the same material is also stacked in the source and drain select transistor regions B and C and a number of the transistor regions to form a gate oxide film and a gate.

In this case, the tunnel oxide film 102 and the floating gate 103 of the cell region A can be formed by a different process from the isolation film formation process or can be formed simultaneously with the isolation film formation process. That is, after an isolation film is formed by a STI process, the tunnel oxide film 102 and the first conduction layer 103 can be formed and then patterned to form a floating gate. The isolation film and the floating gate can be formed at the same time by a self-aligned floating gate process.

Furthermore, 16 or 32 gates of the cell region A can be formed to construct one string. The gates have a distance narrower than that of the gates of the source and drain select transistor regions B and C or the gates of the high voltage and low voltage transistor regions. That is, the pattern density of the cell region A is more crowded than that of the source and drain select transistor regions B and C and other transistor regions. An ion implant process is then performed to form junctions 106 in the exposed semiconductor substrate 101 of the cell region A and the source and drain select transistor regions B and C.

Referring to FIG. 1b, a second dielectric film 107 of an Oxide-Nitride-Oxide (ONO) structure is formed on the entire structure, a third conduction layer 108 such as a polysilicon film is formed. The third conduction layer 108 and the second dielectric film 107 are blanket etched to form spacers on gate sidewalls of the source and drain select transistor regions B and C. At this time, spacers are not formed on the gates of the cell region A since they have a narrow distance, but the second dielectric film 107 and the third conduction layer 108 are filled between the gates of the cell region A. The third conduction layer 108 remaining on the source and drain select transistor regions B and C is then removed.

Referring to FIG. 1c, after a first insulation film 111 is formed on the entire structure, the first insulation film 111 is etched so that the junction of the source select transistor region B, i.e., the source 109 is exposed, thus forming a source contact hole. After a conduction layer is formed to bury the source contact hole, the conduction layer is polished to form a source contact plug 112.

After a second insulation film 113 is formed on the entire structure, the second insulation film 113 and the first insulation film 111 are etched so that the junction of the drain select transistor C, i.e., the drain 110 is exposed, thus forming a drain contact hole. After a conduction layer is formed to bury the drain contact hole, the conduction layer is polished to form a drain contact plug 114.

A predetermined region of the second insulation film 13 and the first insulation film 111 is then etched to form a contact hole through which a predetermined region of the third conduction layer 108 is exposed. After the conduction layer is formed so that the contact hole is buried and then polished to form a plug 115.

Meanwhile, the floating gate interference effect of a NAND flash memory cell can be expressed in the following Equation 1. This is proportional to variation in threshold voltages of peripheral cells and the interference coupling ratio expressed by Equation 2. The interference coupling ratio of a NAND flash memory cells is approximately 0.1 and $\Delta V_{fg}$ thereof is approximately 0.6V.

$$\Delta V_{fg} = \frac{C_{FGX}}{C_{TUN} + C_{ONO} + 2C_{FGX} + 2C_{FGY} + 2C_{FGCG}} \Delta V_1 \quad (1)$$

$$\gamma_{fg} = \frac{C_{FG}}{C_{TUN} + C_{ONO} + 2C_{FGX} + 2C_{FGY} + 2C_{FGCG}} \quad (2)$$

where $C_{TUN}$ is capacitance of a tunnel oxide film, $C_{ONO}$ is capacitance of a dielectric film, $C_{FGX}$ is capacitance between floating gates that share a control gate, $C_{FCCG}$ is capacitance between neighboring floating gates that do not share a control gate, and $C_{FGCG}$ is capacitance between a floating gate and a control gate.

However, as the dielectric film and the conduction layer are formed between the cell gates of the NAND flash memory device, the interference coupling ratio is kept to 0.01, which is 1/10 lower than that of a general structure. Therefore, in the case where a NAND flash memory cell having this structure is formed, the inter-cell interference effect can be lowered to 0.06V.

Furthermore, Table 1 shows bias application conditions depending on a driving method of the NAND flash memory device according to the present invention. That is, for the purpose of a read operation of a selected block, 0V is applied to a selected word line, 4.5V is applied to a non-selected word line, 4.5V is applied to a drain select transistor and a source select transistor, respectively, 1V is applied to a selected bit line, 0V is applied to a non-selected bit line, 0V is applied to a source line, 0V is applied to a bulk, and 0V is applied to a conduction layer formed between the cell gates.

Furthermore, for a program operation of a selected block, a program voltage of Incremental Step Pulse Programming (ISSP) method is applied to a selected word line, 9.5V is applied to a non-selected word line, Vcc and 0V are applied to a drain select transistor and a source select transistor, respectively, 0V is applied to a selected bit line, Vcc is applied to a non-selected bit line, Vcc is applied to a source line, 0V is applied to a bulk, and 0V is applied to a conduction layer formed between the cell gates.

Furthermore, for an erase operation of a selected block, 0V is applied to a selected word line and a non-selected word line, respectively, a drain select transistor, a source select transistor, a selected bit line, a non-selected bit line and a source line are floated, 19V is applied to a bulk, and 0V is applied to a conduction layer formed between the cell gates.

TABLE 1

| Unit [V] | Selected Block | | | Non-Selected Block | | |
|---|---|---|---|---|---|---|
| | Read | Program | Erase | Read | Program | Erase |
| sel W/L | 0 | ISPP | 0 | floated | floated | floated |
| pass W/L | 4.5 | 9.5 | 0 | floated | floated | floated |
| DSL | 4.5 | Vcc | floated | 0 | 0 | floated |
| SSL | 4.5 | 0 | floated | 0 | 0 | floated |
| sel B/L | 1 | 0 | floated | 1 | 0 | floated |
| unsel B/L | 0 | Vcc | floated | 0 | Vcc | floated |
| S/L | 0 | Vcc | floated | 0 | Vcc | floated |
| Bulk | 0 | 0 | 19 | 0 | 0 | 19 |
| Third conduction layer | 0 | 0 | 0 | 0 | 0 | 0 |

As described above, a dielectric film and a conduction layer may be formed between cell gates so that between-cell gates are buried. Therefore, an interference effect between floating gates, which becomes profound with the level of integration increasing, and program threshold voltage distributions between cells can be improved.

Furthermore, a prior art cell has the distribution of 1.5V when a program operation of ISPP is applied. If the structure of one of the herein described embodiment is applied, however, the distribution can be improved up to 0.9V. This can control over-program fail.

Furthermore, an effect in which a program threshold voltage of neighboring cell gates is lowered is about 0.3V when a program operation is performed by applying a voltage of 18.5V to the source and drain select transistors. This means that the program threshold voltage distribution can be improved by forming the conduction layer between the cell gates.

Although the foregoing description has been made with reference to the preferred embodiments, it is to be understood that changes and modifications of the present invention may be made by the ordinary skilled in the art without departing from the spirit and scope of the present invention set forth in the appended claims.

What is claimed is:

1. A NAND flash memory device, comprising:
   a semiconductor substrate in which a cell region, a source select transistor region and a drain select transistor region are defined;
   in the cell region;
   a junction formed in the semiconductor substrate between the cell gates;
   source and drain select transistors formed in the source select transistor region and the drain select transistor region;
   a source formed in the semiconductor substrate between source select transistors and a drain formed in the semiconductor substrate between drain select transistors;
   a dielectric layer over the source and the drain select transistors and the cell gates;
   a conductive layer formed on the dielectric layer to fill a gap of the cell gates in the cell region;
   a first insulating layer formed over the dielectric layer and the conductive layer in the cell region and the source and drain select transistor regions; and
   a plug formed in the cell region to connect to the conductive layer.

2. The NAND flash memory device of the claim 1, wherein the dielectric layer is formed of Oxide-Nitride-Oxide (ONO) structure.

3. The NAND flash memory device of the claim 1, wherein the conductive layer is formed of a poly-silicon.

4. The NAND flash memory device of the claim 1, the dielectric layer over the source and drain select transistors formed as a spacer.

5. The NAND flash memory device of the claim 1, further comprising:
   a source contact plug formed in the source select transistor region;
   a second insulating layer formed over the source contact plug and the first insulating layer; and
   a drain contact plug formed in the drain select transistor region.

6. The NAND Flash memory device of the claim 1, wherein the plug is formed of a poly-silicon.

7. The NAND Flash memory device of the claim 1, wherein a space of the cell gates is shorter than that of the source and drain select transistors.

* * * * *

UNITED STATES PATENT AND TRADEMARK OFFICE
CERTIFICATE OF CORRECTION

| | | |
|---|---|---|
| PATENT NO. | : 7,310,267 B2 | Page 1 of 1 |
| APPLICATION NO. | : 11/275282 | |
| DATED | : December 18, 2007 | |
| INVENTOR(S) | : Tae U. Youn | |

It is certified that error appears in the above-identified patent and that said Letters Patent is hereby corrected as shown below:

At Column 5, line 31, "in the cell region;" should be -- cell gates in the cell region; --.

Signed and Sealed this

First Day of July, 2008

JON W. DUDAS
*Director of the United States Patent and Trademark Office*